United States Patent
Wendling et al.

(10) Patent No.: US 6,799,990 B2
(45) Date of Patent: Oct. 5, 2004

(54) CRIMP CONNECTOR

(75) Inventors: Hannes Jahn Wendling, Langen (DE);
Olivier De Cloet, Bensheim (DE);
Jonny Jauris, Langen (DE)

(73) Assignee: Tyco Electronics AMP GmbH, Bensheim (DE)

( * ) Notice: Subject to any disclaimer, the term of this patent is extended or adjusted under 35 U.S.C. 154(b) by 0 days.

(21) Appl. No.: 10/679,855

(22) Filed: Oct. 6, 2003

(65) Prior Publication Data

US 2004/0137802 A1 Jul. 15, 2004

(30) Foreign Application Priority Data

Oct. 7, 2002 (EP) .............................................. 02022305

(51) Int. Cl.⁷ .............................................. H01R 4/24
(52) U.S. Cl. ...................................................... 439/422
(58) Field of Search ............................... 439/421–424, 439/877

(56) References Cited

U.S. PATENT DOCUMENTS

| | | | | |
|---|---|---|---|---|
| 3,259,874 A | | 7/1966 | Esser ........................... | 339/97 |
| 3,395,381 A | * | 7/1968 | Huffnagle ................... | 439/422 |
| 3,696,322 A | | 10/1972 | Spangler et al. .......... | 339/97 C |
| 3,697,925 A | | 10/1972 | Henschen .................. | 339/17 F |
| 3,715,457 A | | 2/1973 | Teagno et al. ............. | 174/88 R |
| 3,937,403 A | | 2/1976 | Lawson ..................... | 339/97 C |
| 3,960,430 A | | 6/1976 | Bunnell et al. ............ | 339/97 C |
| 4,066,319 A | | 1/1978 | Baker et al. ............... | 339/97 R |
| 4,082,402 A | | 4/1978 | Kinkaid et al. ............ | 339/97 |
| 4,106,836 A | | 8/1978 | Asick et al. ............... | 339/97 |
| 4,270,828 A | | 6/1981 | Thurston ................... | 339/94 R |
| 4,669,798 A | * | 6/1987 | Daum et al. ............... | 439/423 |
| 4,749,368 A | * | 6/1988 | Mouissie .................... | 439/421 |
| 6,086,413 A | | 7/2000 | Karasik et al. ............. | 439/516 |

FOREIGN PATENT DOCUMENTS

| | | | |
|---|---|---|---|
| EP | 0973232 | 1/2000 | ........... H01R/4/18 |

OTHER PUBLICATIONS

European Search Report; Application No. EP 03 02 1685; dated Jan. 27, 2004.

* cited by examiner

*Primary Examiner*—Ross Gushi
(74) *Attorney, Agent, or Firm*—Barley, Snyder, Senft & Cohen, LLC

(57) ABSTRACT

A crimp connector for electrical contacting at least one electrical conductor embedded in an insulating material. The crimp connector has a crimping region comprising a base having at least one contact strip and at least one piercing tine. The at least one contact strip has a tapered tip and is arranged on the base such that the tapered tip penetrates an insulating material of a conductor from a lower surface to contact an electrical conductor therein when crimped. The at least one piercing tine has a tapered end region and is arranged on the base such that the tapered end region penetrates the insulating material of the conductor from an upper surface to contact the electrical conductor therein when crimped.

14 Claims, 7 Drawing Sheets

CRIMP CONNECTOR

FIELD OF THE INVENTION

The invention relates to a crimp connector for electrical contacting an electrical conductor embedded in an insulating layer. The invention further relates to a method for electrical contacting an electrical conductor embedded in an insulating layer by means of a crimp connector.

BACKGROUND OF THE INVENTION

Crimp connectors are a fast, economical and reliable type of electrical connection for electrical conductors. Crimp connectors are preferably used in motor vehicle electronic devices where electrical connections are subjected to extremely rough environmental conditions and must have vibration stability, resistance to corrosion, temperature stability and current-carrying capacity.

The crimp connectors are commonly provided with corresponding piercing tines that are used as penetration connectors for contacting foil electrical conductors, such as flexible flat cables (FFC) or flexible printed circuit boards (FPC). An example of this type of crimp connector is shown in FIG. 16. The crimp connector of FIG. 16 has a base 108, which may be connected, for example, to a plug contact, and at least one piercing tine 104 that contacts an electrical conductor 122 of a flat conductor 124 by penetrating insulating material 120 provided thereon. The piercing tines 104 may be formed with a tapering, sharp-edge-type structure, so they cut into the electrical conductor 122 during assembly, as shown, for example, in U.S. Pat. No. 4,082,402 (Kincaid et al), U.S. Pat. No. 4,106,836 (Asick et al), U.S. Pat. No. 4,270,828 (Thurston) and U.S. Pat. No. 4,669,798 (Daum et al). During assembly, the piercing tines 104 are pressed downward with the aid of a suitable crimping tool in a direction of the electrical conductor 122 to penetrate the insulating material 120 and contact the electrical conductor 122.

U.S. Pat. No. 3,715,457 (Teagno et al) and U.S. Pat. No. 3,697,925 (Henschen) further teach the crimp connector with bent-up edges for providing strain relief in addition to the actual crimped contact. Additionally, U.S. Pat. No. 3,937,403 (Lawson) and U.S. Pat. No. 3,960,430 (Bunnell et al) teach contacting the electrical conductors embedded in the insulating material exclusively via contact projections formed on the base of the crimp connector. The piercing tines, thereby only mechanically fix the crimp connector to the flat conductor and do not penetrate the insulating material.

There is a problem, however, in that in the above-described crimp connectors, a layer of the insulating material remains between the base of the crimp connector and the electrical conductor to be contacted, whereby changes in shape, caused by, e.g., thermal changes in the insulating material, may have a negative effect on the quality of the electrical contact. For example, in the use of extruded flat conductors (exFLC) (which are increasingly employed in automobile construction, ship and aircraft cabling or industrial computers, because they are inexpensive and offer the advantage of more flexibility, space-saving and absolute water-tightness) where no prefabricated laminating foils have to be additionally bought and the plastics material sleeve is made directly from a granulate, the extruded foils may be subjected to high temperatures that cause the plastic materials of the insulating material to yield during thermal loading (U.S. Pat. No. 4,082,402 and U.S. Pat. No. 4,669,798).

A solution to this problem is accorded in U.S. Pat. No. 3,697,925 wherein the electrical conductor is stripped of the insulating material prior to attachment of the crimp connector. This solution, however, has the disadvantage in that defined removal of the insulating material is time-consuming and technically demanding. For example, this process requires the use of high-precision milling technology or expensive laser technology. Moreover, susceptibility to corrosion in the contact zone is increased, and mechanical stability is reduced.

SUMMARY OF THE INVENTION

An object of the invention therefore is to provide an improved crimp connector that can be assembled easily, inexpensively and efficiently while ensuring safe electrical contact even in cases where there are thermal changes in the properties of the insulating material.

This and other objects are achieved by a crimp connector having a crimping region including a base having at least one contact strip and at least one piercing tine. The at least one contact strip has a tapered tip and is arranged on the base such that the tapered tip penetrates an insulating material of a conductor from a lower surface to contact an electrical conductor therein when crimped. The at least one piercing tine has a tapered end region and is arranged on the base such that the tapered end region penetrates the insulating material of the conductor from an upper surface to contact the electrical conductor therein when crimped.

This and other objects are further achieved by a method for electrical contacting at least one electrical conductor embedded in an insulating material. A conductor is positioned adjacent to a contact strip arranged on base of a crimp connector. A piercing tine arranged on the base so that the crimp connector is deformed to at least partially encircle the conductor. An upper surface of the insulating material is penetrated with a tip of the piercing tine. A lower surface of the insulating material is penetrated with a tip of the contact strip. The respective tips of the piercing tine and the contact strip contact the electrical conductor.

DETAILED DESCRIPTION OF THE INVENTION

FIGS. 1–7 show a first embodiment of a crimp connector 100. Only an actual crimping region 102 of the crimp connector 100 is shown. A second crimping region or a plug-in connector element, for example, may adjoin the crimping region 102. The crimp connector 100 may also only consist of the crimping region 102 shown and, thus, be used as a penetration connector for connecting a plurality of insulating foils with embedded flexible electrical conductor paths.

Figures 2, 3:
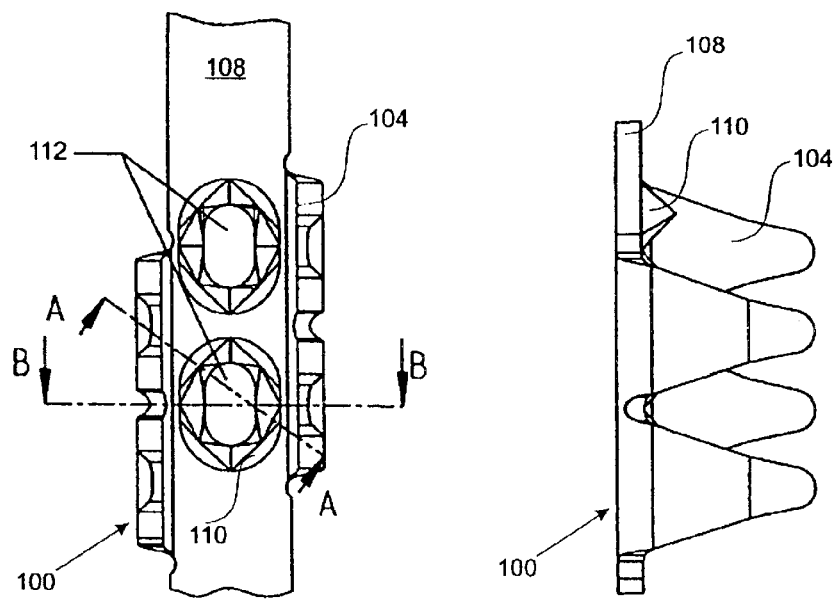
FIG. 2 is a top view of a horizontal projection on the crimp connector of FIG. 1.
FIG. 3 is a side view of the crimp connector of FIG. 1.
Figures 1, 4:
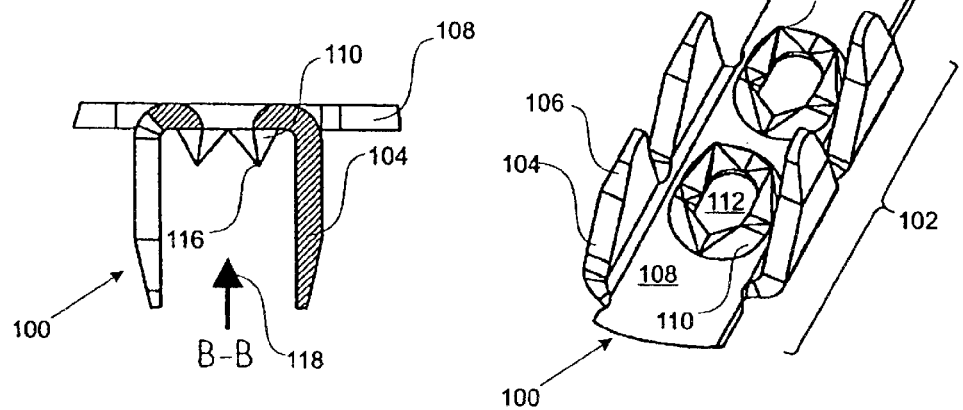
FIG. 1 is a perspective view of a crimping region of a first embodiment of a crimp connector.
FIG. 4 is a sectional view of the crimp connector of FIG. 1 taken along line B—B of FIG. 2.
Figure 5:
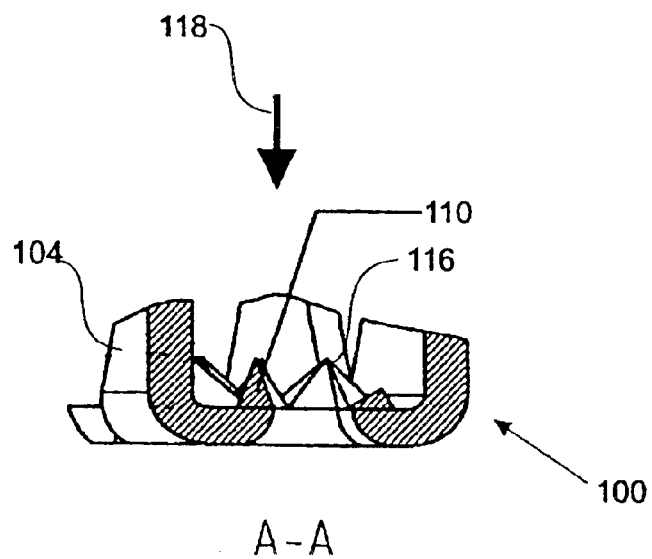
FIG. 5 is a sectional view of the crimp connector of FIG. 1 taken along line A—A of FIG. 2.

The crimp connector 100 has a base 108 provided with four elliptical orifices 112. Although the orifices 112 in the embodiment shown have an elliptical shape, the orifices 112 are not restricted to this shape and may be shaped in any other desired configuration, for example, the orifices 112 may be circular or rectangular. A contact strip 110 is formed on the base 108 and arranged around each of the elliptical orifices 112. As best shown in FIGS. 3 and 4, the contact strips 110 have an approximately pyramid-shaped structure with a sharply tapering tip 116 in an end region.

Figure 6:
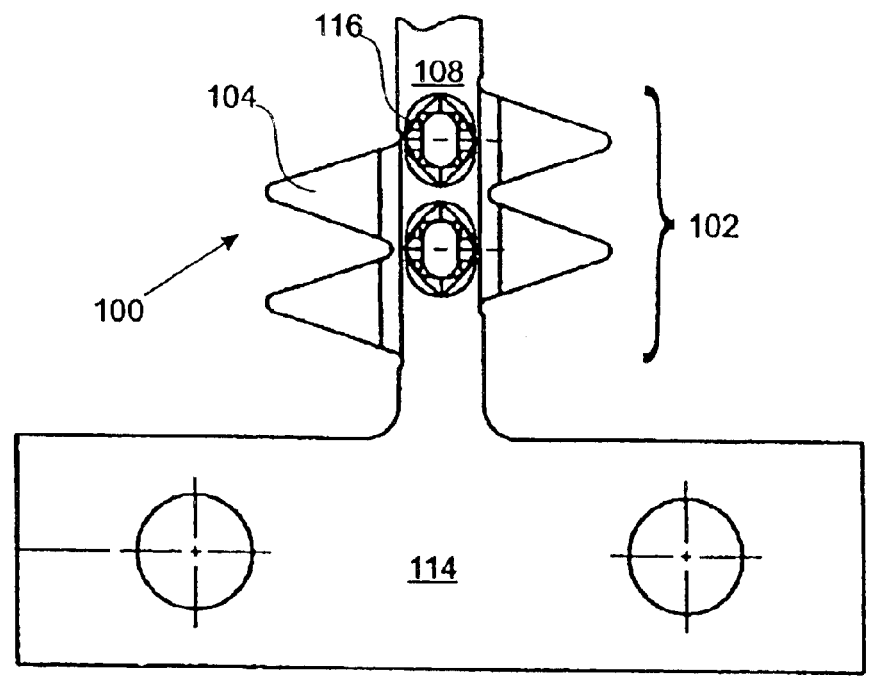
FIG. 6 is a partial view of the punch tape layout for the crimp connector.

Four piercing tines 104 are formed on the base 108 and extend from sides of the base 108. The piercing tines 104 have tapering end regions 106. Although in the embodiment shown all four piercing tines 104 are shaped identically, the piercing tines 104 may also be configured at different heights in order to be able to achieve different penetration depths, e.g., with multiple-layered wiring. For example, the piercing tines 104 located diagonally opposite one another may be of an identical shape. Additionally, although the number of piercing tines 104 in the embodiment shown is four, any number of piercing tines 104 may be used depending on the desired configuration of the crimp connector 100. As shown in FIG. 6, in a delivery state a plurality of the crimp connectors 100 may be connected to one another via subsequently removable punch tape webs 114.

Figure 7:
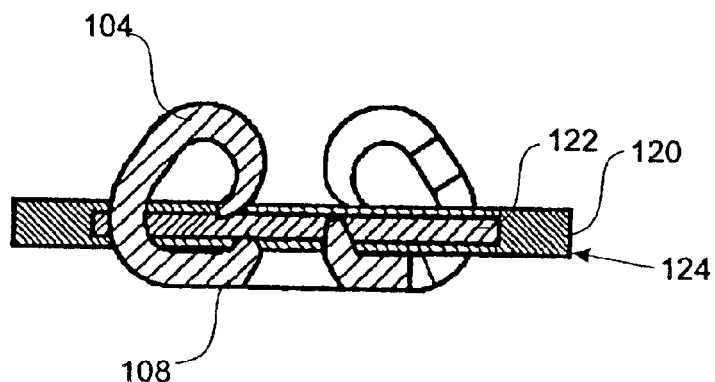
FIG. 7 is a sectional view through the crimp connector in a crimped state.
Figure 16:
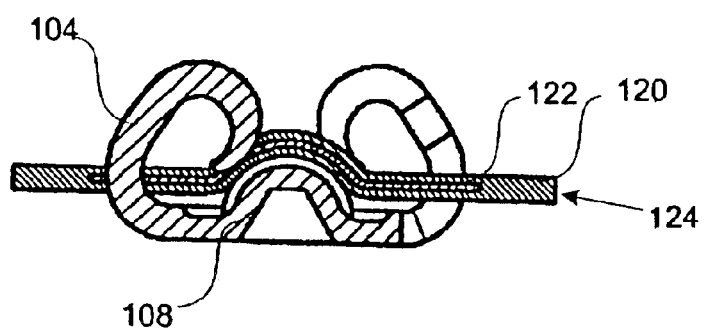
FIG. 16 is a sectional view through a conventional crimp connector in a crimped state.

The assembly of the crimp connector 100 to a flat conductor 124 will now be described in greater detail. The flat conductor 124 includes an electrical conductor 122 and insulating material 120, as shown in FIG. 7. The flat conductor 124 is positioned above the crimp connector 100 and pressed in direction 118, as shown in FIG. 4. With the aid of a suitable crimping tool, pressure is exerted in the direction 118 and onto the piercing tines 104 so that the piercing tines 104 bend in the shape of a semi-circle, as shown in FIG. 7. The piercing tines 104 are bent until end regions of the piercing tines 104 cut through the insulating material 120 and contact the electrical conductor 122. The pyramid-shaped configuration of the contact strips 110, in particular the beveled outer flanks facing the piercing tines 104, guide the piercing tines 104 to promote arch-shaped bending. Simultaneously, the contact strips 110 penetrate the insulating material 120 from below and come into electrical contact with the electrical conductor 122. The tapering tips 116 allow for a considerable mechanical force to be exerted on the insulating material 120 of the flat conductor 124 when pressure is applied in the direction 118, so that the contact strips 110 cut through the insulating material 120 and the electrical conductor 122.

After penetration of the insulating material 120 by the tapering tips 116, the insulating material 120 hermetically seals against corrosive environmental influences around the piercing tines 104 and the contact strips 110. Further, because the end regions of the piercing tines 104 and the tapering tips 116 of the contact strips 110 are substantially opposite one another, a favorable mechanical force distribution takes place that securely holds the electrical conductor 122 even in rough environmental conditions. The electrical conductor 122 is thereby securely clamped between the piercing tines 104 and the contact strips 110 without the insulating material 120 enclosed therebetween.

Although in FIG. 7 only one flat conductor 124 is shown, the crimp connector 100 may also be used, for example, with multiple flat conductors 124 positioned on top of one another. The height of the contact strips 110 may then be adjusted to contact different electrical conductors 122 of the stacked flat conductors 124. Additionally, the crimp connector 100 may be used with electrical conductors other that the flat conductor 124 with the rectangular cross-section that is shown, for example, the electrical conductor may have any other cross-sectional configuration, such as circular.

Figure 8:
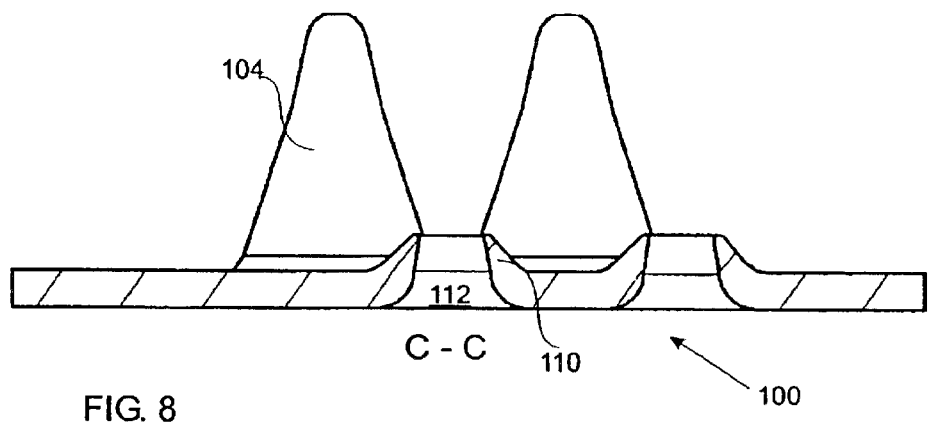
FIG. 8 is a sectional view of a second embodiment of the crimp connector taken along line C—C of FIG. 9.
Figure 9:
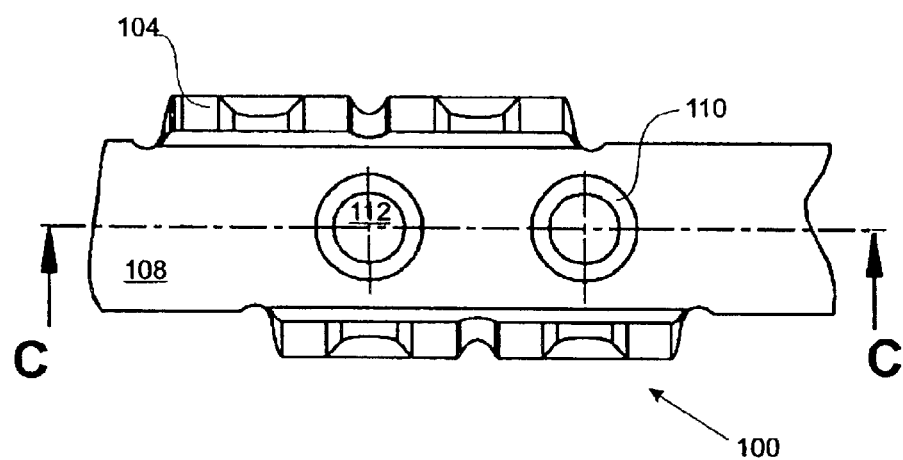
FIG. 9 is a top view of a horizontal projection on the crimp connector according to the second embodiment.

FIGS. 8 and 9 show a second embodiment of the crimp connector 100. The second embodiment differs from the first embodiment in that the second embodiment has two cone-shaped contact strips 110 with circular orifices 112. The contact strips 110 have annular sharp edges that ensure reliable contact with the electrical conductor 122.

Figure 10:
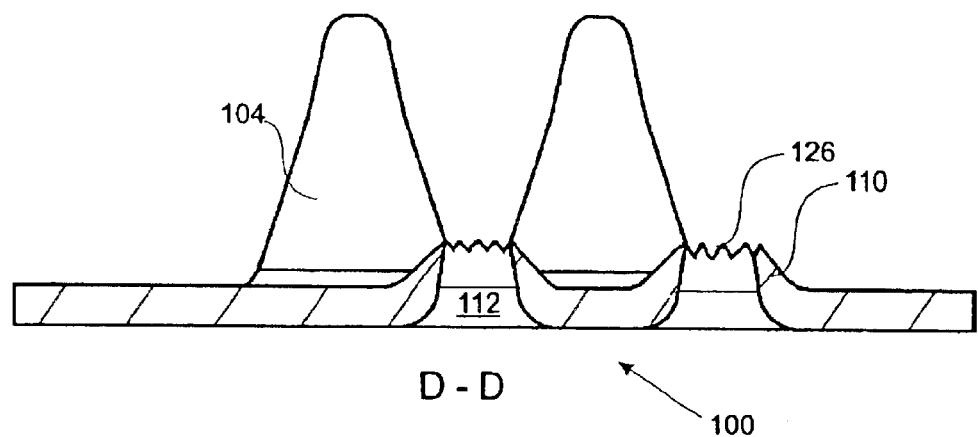
FIG. 10 is a sectional view of a third embodiment of the crimp connector taken along line D—D of FIG. 11.
Figure 11:
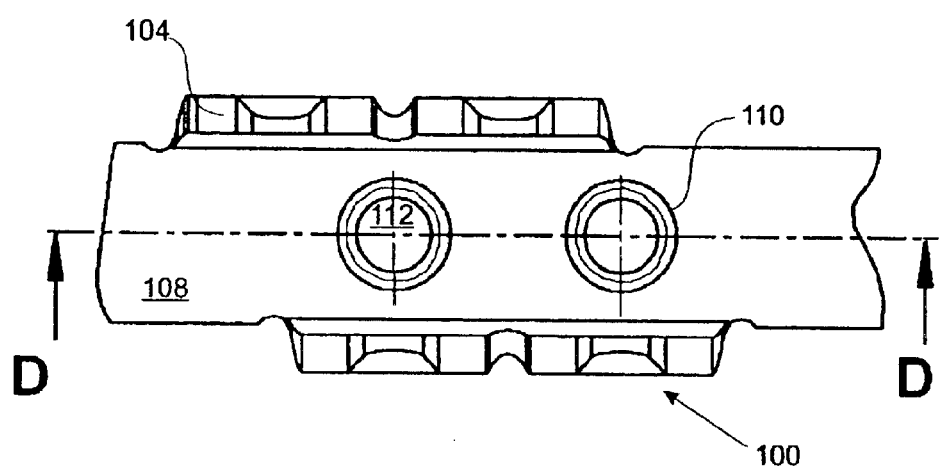
FIG. 11 is a top view of a horizontal projection on the crimp connector according to the third embodiment.

FIGS. 10 and 11 show a third embodiment of the crimp connector 100. The third embodiment differs from the other embodiments in that in the third embodiment the contact strips 110 have annular sharp edges formed by a set of teeth 126 provided thereon.

Figure 12:
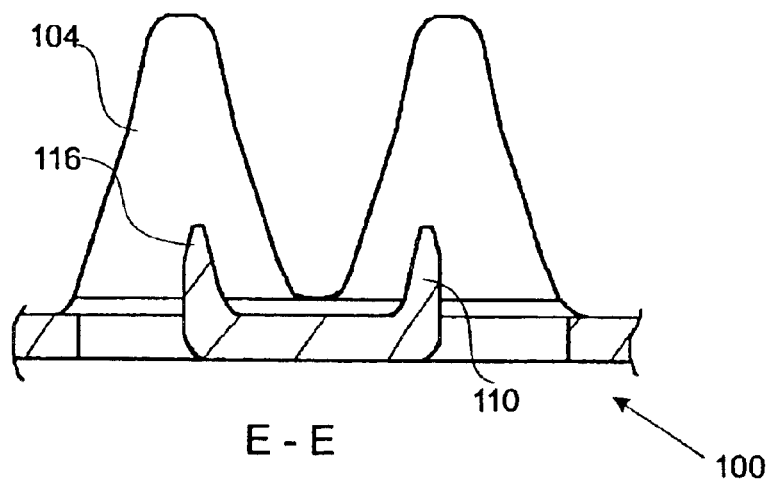
FIG. 12 is a sectional view of the crimp connector according to the fourth embodiment taken along line E—E of FIG. 13.
Figure 13:
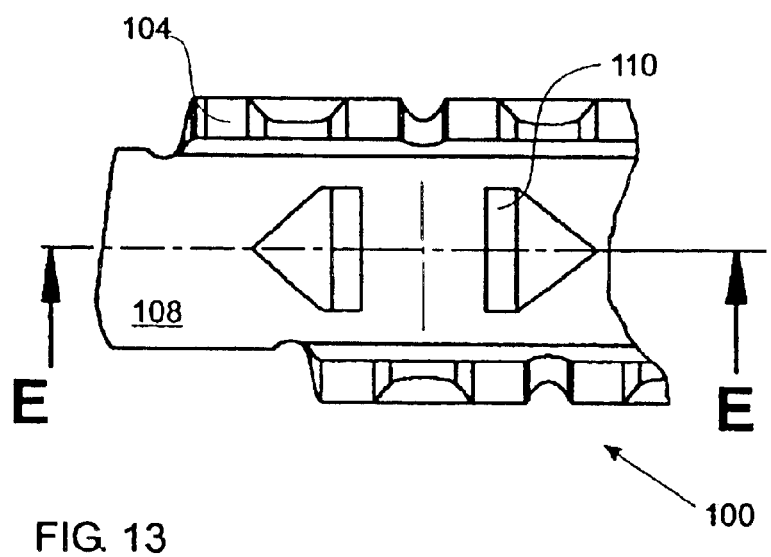
FIG. 13 is a top view of a horizontal projection on the crimp connector according to the fourth embodiment.
Figure 14:
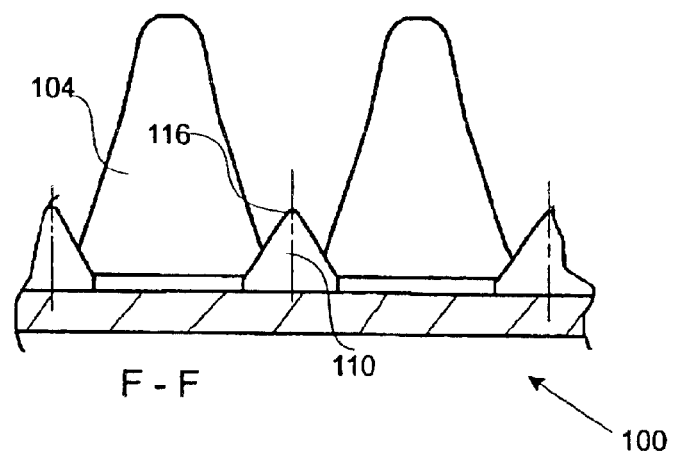
FIG. 14 is a sectional view of a fifth embodiment of a crimp connector taken along line F—F of FIG. 15.
Figure 15:
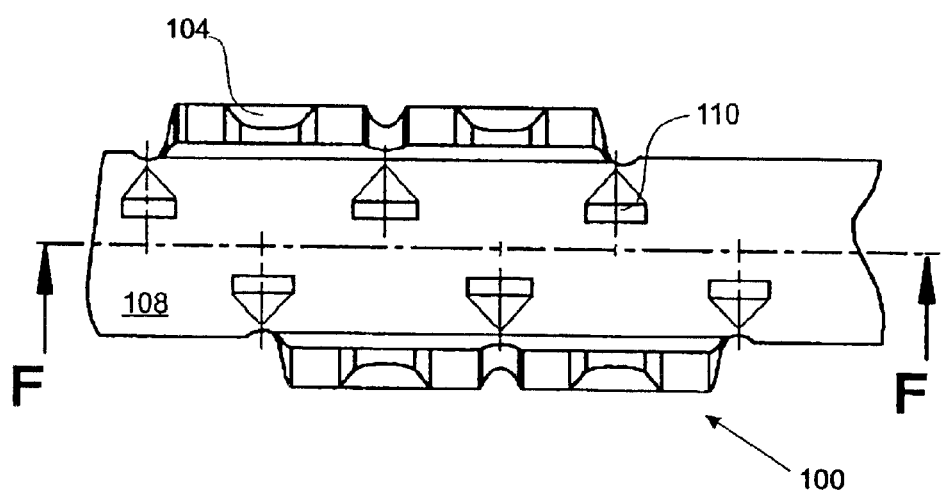
FIG. 15 is a top view of a horizontal projection on the crimp connector according to the fifth embodiment.

FIGS. 12–13 show a fourth embodiment of the crimp connector 100, and FIGS. 14–15 show a fifth embodiments of the crimp connector 100. The fourth embodiment differs from the other embodiments in that in the fourth embodiment the contact strips 110 are formed by being individually bent-up from the base 108. A base line of the contact strips 110 may run either substantially transversely to a longitudinal axis of the crimp connector 100, as shown in FIGS. 12 and 13, parallel thereto, as shown in FIGS. 14 and 15. In each case the tip 116 is configured for optimally contacting the electrical conductor 122.

Because the contact strip 110 arranged in the base 108 of the crimp connector 100 penetrates the insulating material 120 and electrically contacts the electrical conductor 122 in addition to the piercing tine 104, the electrical conductor 122 is contacted from an upper and lower side to ensure a particularly safe and stable electrical connection. Hence, no insulating material 120 having temperature-dependent mechanical properties is contained in the contacting bond, and a stable electrical connection is guaranteed even at higher operating temperatures. The geometric configuration of the base 8 to have a pointed contact strip 110 or a plurality of strips 110 has the advantage that the insulating material 120 may be easily penetrated to eliminate the need for stripping the flat conductor 124. The pointed strip 110 additionally has the advantage that the imperviousness of the insulating material 120 to environmental influences continues to be maintained and, thus, corrosion may be effectively prevented. The properties of the crimp connector 100 are particularly advantageous if the insulating material 120 is a foil. Because foils are widespread and crimping of the electrical conductors therein has proved to be a particularly advantageous contacting method, the crimp connector 100 ensures a particularly stable and safe contact is produced.

In order to guarantee stable, safe contact, even with large tolerance differences between the geometry of the electrical conductor 122 and the insulating material 120, the base 108 is provided with at least one ring of contact strips 110 that is formed by a multiplicity of contact strips 110 arranged substantially annularly around a common center point or by individually erected contact strips 110. Particularly safe and, with respect to mechanical loading, stable electrical and mechanical contact may also be achieved by a crimp connector 100 that has four or more piercing tines 104 which are arranged substantially opposite one another and offset in pairs wherein the piercing tines 104 are bent towards one another and form a frictional connection to the contact strip 110 arranged on the base 108 between the piercing tines 104. Further, because deformation of the piercing tine 104 takes place by means of a crimping tool that presses with a defined force against the piercing tine 104, a particularly reliable electrical contact is guaranteed.

The method for electrical contacting at least one electrical conductor 122 embedded in the insulating material 120 by means of the crimp connector 100 is particularly inexpensive and time-saving, because stripping the flat conductor 124 before attaching the crimp connector 100 is not necessary.

What is claimed is:

1. A crimp connector having a crimping region, comprising:

a base having at least one contact strip and at least one piercing tine;

the at least one contact strip having a tapered tip and arranged on the base such that the tapered tip penetrates an insulating material of a conductor from a lower surface to contact an electrical conductor therein when crimped;

the at least one piercing tine having a tapered end region and arranged on the base such that the tapered end region penetrates the insulating material of the conductor from an upper surface to contact the electrical conductor therein when crimped; and the at least one contact strip having a pyramid-shaped structure to guide the at least one piercing tine into contact with the electrical conductor.

2. The crimp connector of claim 1, wherein the at least one piercing tine extends from a side of the base.

3. The crimp connector of claim 1, wherein the base includes at least one orifice around which the at least one contact strip is arranged.

4. The crimp connector of claim 1, wherein the insulating material is a foil.

5. The crimp connector of claim 1, wherein the at least one contact strip and the at least one piercing tine form a semicircular arc when crimped.

6. The crimp connector of claim 1, wherein the at least one contact strip is formed on the base.

7. The crimp connector of claim 1, wherein the at least one contact strip is arranged substantially annularly around a common center point of the base.

8. A crimp connector having a crimping region, comprising:

a base having two sides;

contact strips having a tapered tip and arranged on the base such that the tapered tip penetrates an insulating material of a conductor from a lower surface to contact an electrical conductor therein when crimped;

piercing tines arranged on each of the sides of the base mutually offset from each other, each of the piercing tines having a tapered end region such that the tapered end region penetrates the insulating material of the conductor from an upper surface to contact the electrical conductor therein when crimped; and the contact strips having a pyramid-shaped structure to guide the piercing tines into contact with the electrical conductor.

9. The crimp connector of claim 8, wherein the piercing tines are arranged on the base to flank the contact strips.

10. The crimp connector of claim 8, wherein the base includes orifices around which the contact strips are arranged.

11. The crimp connector of claim 8, wherein the insulating material is a foil.

12. The crimp connector of claim 8, wherein the contact strips and the piercing tines form a semicircular arc when crimped.

13. The crimp connector of claim 8, wherein the contact strips and the piercing tines are formed on the base.

14. The crimp connector of claim 8, wherein the contact strips are arranged substantially annularly around a common center point of the base.

* * * * *

UNITED STATES PATENT AND TRADEMARK OFFICE
CERTIFICATE OF CORRECTION

PATENT NO. : 6,799,990 B2
DATED : October 5, 2004
INVENTOR(S) : Wendling et al.

It is certified that error appears in the above-identified patent and that said Letters Patent is hereby corrected as shown below:

Column 4,
Line 37, "embodiments" should read -- embodiment --.
Line 44, "13, parallel" should read -- 13, or, parallel --.

Signed and Sealed this

First Day of February, 2005

JON W. DUDAS
*Director of the United States Patent and Trademark Office*